(12) United States Patent
Levesque et al.

(10) Patent No.: US 9,529,435 B2
(45) Date of Patent: Dec. 27, 2016

(54) SYSTEMS AND METHODS FOR PROVIDING HAPTIC NOTIFICATIONS

(71) Applicant: IMMERSION CORPORATION, San Jose, CA (US)

(72) Inventors: Vincent Levesque, Montreal (CA); David M. Birnbaum, Oakland, CA (US); Amaya Becvar Weddle, San Jose, CA (US); Robert Lacroix, San Jose, CA (US); Juan Manuel Cruz-Hernandez, Montreal (CA); Danny A. Grant, Laval (CA); Neil Olien, Montreal (CA); Erin B. Ramsay, Montreal (CA); Ali Modarres, San Jose, CA (US)

(73) Assignee: Immersion Corporation, San Jose, CA (US)

( * ) Notice: Subject to any disclaimer, the term of this patent is extended or adjusted under 35 U.S.C. 154(b) by 14 days.

(21) Appl. No.: 14/586,012

(22) Filed: Dec. 30, 2014

(65) Prior Publication Data

US 2015/0185849 A1    Jul. 2, 2015

Related U.S. Application Data

(60) Provisional application No. 61/922,600, filed on Dec. 31, 2013.

(51) Int. Cl.

| H04B 3/36 | (2006.01) |
| G06F 3/01 | (2006.01) |
| G01R 31/36 | (2006.01) |
| G06F 3/041 | (2006.01) |
| G06F 1/16 | (2006.01) |

(52) U.S. Cl.
CPC .......... *G06F 3/016* (2013.01); *G01R 31/3689* (2013.01); *G06F 1/163* (2013.01); *G06F 3/011* (2013.01); *G06F 3/041* (2013.01)

(58) Field of Classification Search
CPC ............. G06F 3/02; G06F 3/0414; G08B 6/00
USPC   340/636.1, 691.6, 4.12, 7.6, 407.1; 345/156
See application file for complete search history.

(56) References Cited

U.S. PATENT DOCUMENTS

| 8,749,495 | B2 | 6/2014 | Grant et al. |
| 2002/0142701 | A1 | 10/2002 | Rosenberg |
| 2006/0267944 | A1 | 11/2006 | Rosenberg et al. |
| 2012/0268412 | A1 | 10/2012 | Cruz-Hernandez et al. |

(Continued)

FOREIGN PATENT DOCUMENTS

| EP | 2 432 202 A1 | 3/2012 |
| EP | 2 664 978 A2 | 11/2013 |

OTHER PUBLICATIONS

Extended European Search Report as issued in European Patent Application No. 14200686.5, dated Jul. 6, 2015.

*Primary Examiner* — Phung Nguyen
(74) *Attorney, Agent, or Firm* — Kilpatrick Townsend & Stockton LLP

(57) ABSTRACT

A system includes a sensor configured to sense relative movement between a surface and a user's skin; a haptic output device configured to generate a haptic effect at the surface; and a processor configured to receive an input signal from the sensor indicating the sensed movement between the surface and the skin of the user, determine whether a notification is to be sent to the user, and output an output signal, based on the notification, to the haptic output device to generate the haptic effect if it is determined that the notification is to be sent to the user.

24 Claims, 11 Drawing Sheets

(56) References Cited

U.S. PATENT DOCUMENTS

| | | | |
|---|---|---|---|
| 2013/0293494 A1* | 11/2013 | Reshef | G06F 3/016 345/173 |
| 2013/0314303 A1* | 11/2013 | Osterhout | G06F 3/005 345/8 |
| 2014/0118127 A1 | 5/2014 | Levesque et al. | |
| 2015/0123775 A1* | 5/2015 | Kerdemelidis | G08B 6/00 340/407.1 |
| 2016/0004308 A1 | 1/2016 | Cruz-Hernandez et al. | |
| 2016/0004309 A1 | 1/2016 | Modarres et al. | |

\* cited by examiner

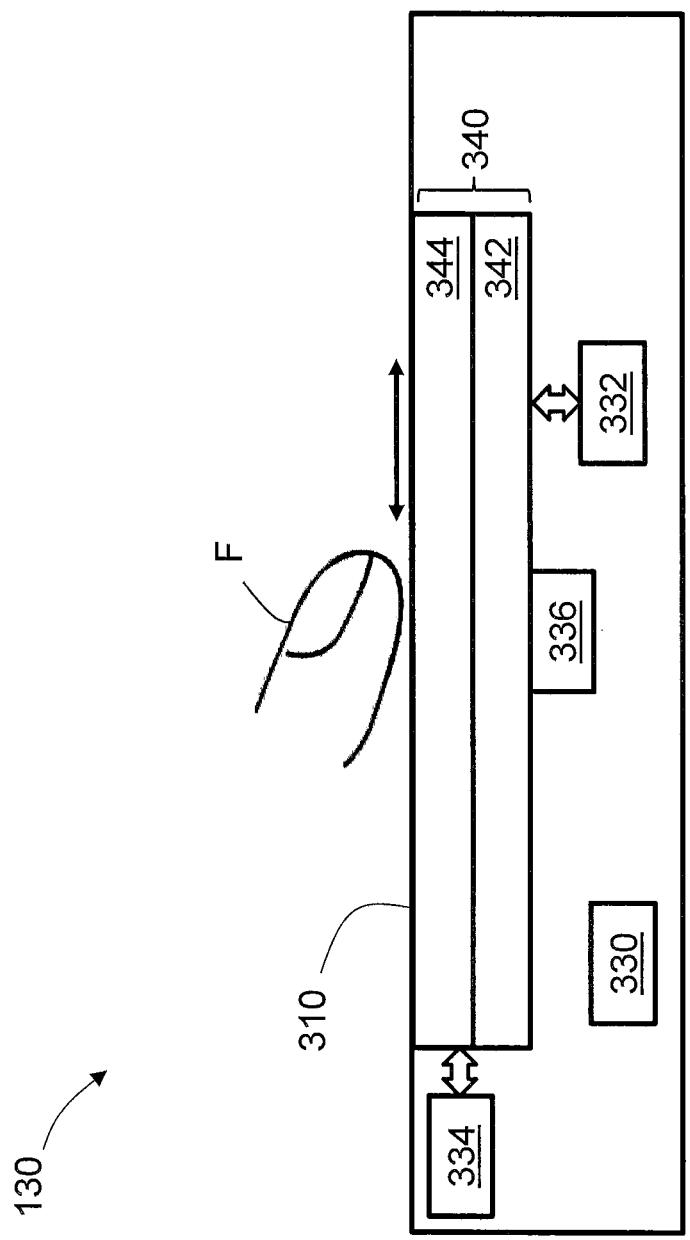

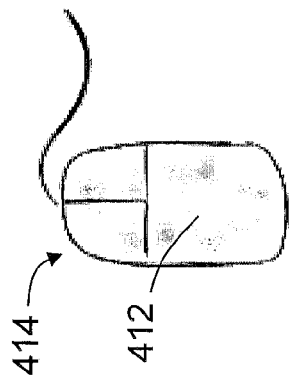
FIG. 4C
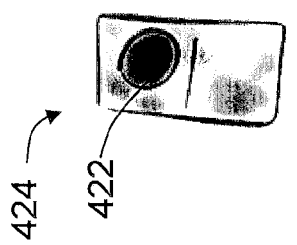
FIG. 4E
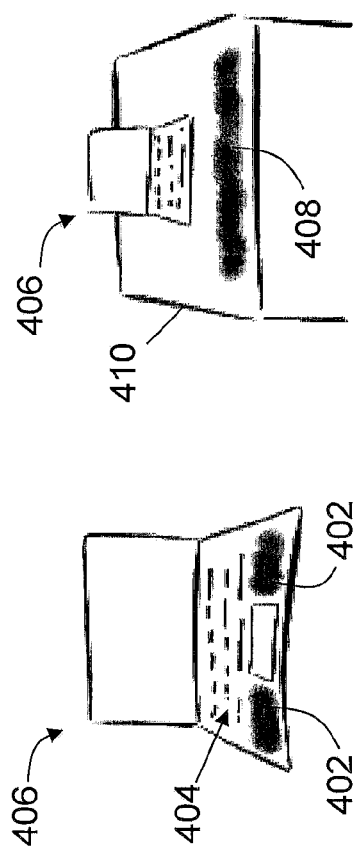
FIG. 4B
FIG. 4A
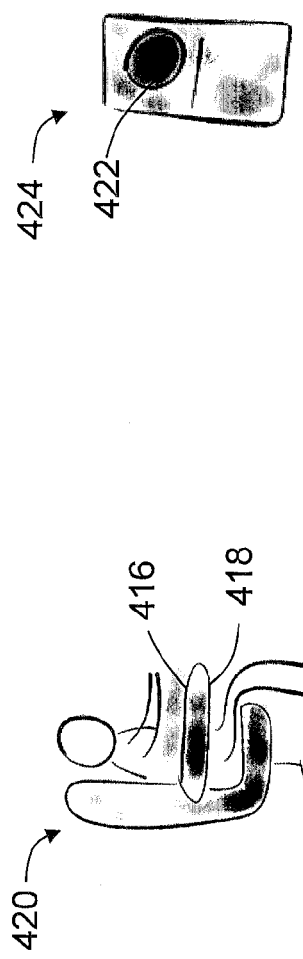
FIG. 4D

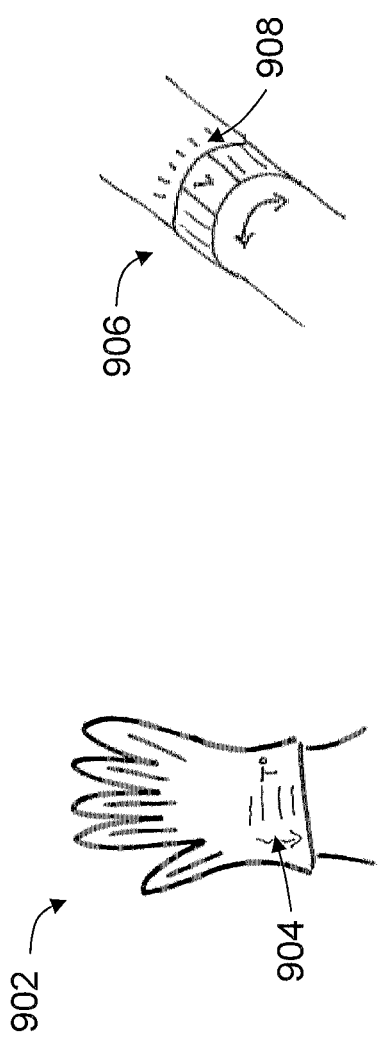

SYSTEMS AND METHODS FOR PROVIDING HAPTIC NOTIFICATIONS

CROSS-REFERENCE TO RELATED APPLICATIONS

This application claims the benefit of priority from U.S. Provisional Patent Application No. 61/922,600, filed Dec. 31, 2013, the entire content of which is incorporated herein by reference.

FIELD

The present invention is related to systems and methods for providing haptic notifications.

BACKGROUND

Haptic feedback may currently be provided to a user when the user is actively using a device that includes a haptic output device configured to generate a haptic effect to the user. For example, when a user touches a touch screen to provide an input to a device that includes a haptic output device, such as a smartphone, the user may receive haptic feedback in the form of a vibration as confirmation that the input was successfully received by the device.

During the course of a typical day, people routinely interact with various surfaces of objects in a manner in which their skin slides against such surfaces, perhaps without even knowing it. For example, when typing on a keyboard of a computer, a person often rests the palms of his/her hands on the top surface of the table supporting the keyboard or on the top surface of the housing of a laptop, depending on the type of computer being used. Movement of the person's fingers on the keyboard causes the palms to slide against the surface supporting the palms.

It is desirable to use such interactions with typically passive surfaces to provide information, such as notifications, to users through haptic feedback by augmenting a wide range of devices with haptic output devices.

SUMMARY

According to an aspect of the present invention, there is provided a system that includes a sensor configured to sense relative movement between a surface and a user's skin; a haptic output device configured to generate a haptic effect at the surface; and a processor configured to receive an input signal from the sensor indicating the sensed movement between the surface and the skin of the user, determine whether a notification is to be sent to the user, and output an output signal, based on the notification, to the haptic output device to generate the haptic effect if it is determined that the notification is to be sent to the user.

In an embodiment, the haptic output device includes an electrostatic friction output device and the haptic effect is a change in friction of the surface. In an embodiment, the haptic effect includes ultrasonic vibrations. In an embodiment, the haptic output device is configured to deform the surface to provide the haptic effect.

In an embodiment, the surface is on a housing of a computer. In an embodiment, the notification includes a low battery warning. In an embodiment, the notification provides an indication of a number of unread messages in the user's inbox.

In an embodiment, the surface and the haptic output device are part of a wearable device. In an embodiment, the wearable device is selected from the group consisting of a watch, a bracelet, a necklace, and eye glasses.

In an embodiment, the notification is based on at least one parameter selected from the group consisting of: time, priority, and quantity.

According to an aspect of the present invention, there is provided a method that includes sensing movement between a surface and a user's skin; determining whether a notification is to be sent to the user; and generating a haptic effect at the surface if it is determined that the notification is to be sent to the user.

In an embodiment, generating the haptic effect includes changing friction of the surface. In an embodiment, generating the haptic effect includes deforming the surface.

These and other aspects, features, and characteristics of the present invention, as well as the methods of operation and functions of the related elements of structure and the combination of parts and economies of manufacture, will become more apparent upon consideration of the following description and the appended claims with reference to the accompanying drawings, all of which form a part of this specification. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

The components of the following Figures are illustrated to emphasize the general principles of the present disclosure and are not necessarily drawn to scale. Reference characters designating corresponding components are repeated as necessary throughout the Figures for the sake of consistency and clarity.

FIG. 3 is a schematic illustration of input/output devices of the system of FIG. 1 in accordance with embodiments of the invention;

FIG. 4A-4E illustrate surfaces of objects against which a user's hands rest for implementations of embodiments of the invention;

FIGS. 9A and 9B illustrate embodiments of the invention as implemented in wearable articles;

DETAILED DESCRIPTION

Figure 1:
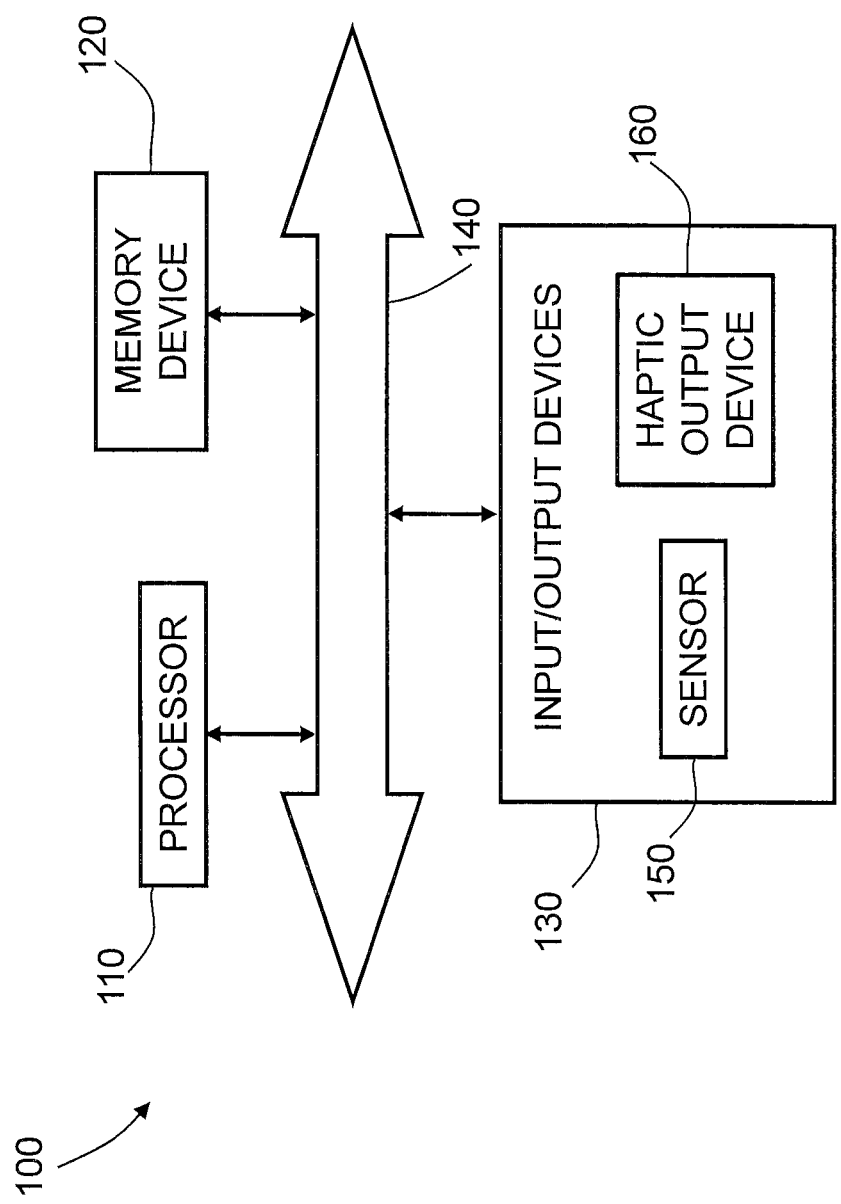
FIG. 1 is a schematic illustration of a system in accordance with embodiments of the invention.

FIG. 1 is a schematic illustration of a system 100 in accordance with an embodiment of the invention. As illustrated, the system 100, which may be in the form of an electronic device, includes a processor 110, a memory device 120, and input/output devices 130, which are interconnected via a bus 140. In an embodiment, the input/output devices 130 may include at least one sensor 150 and at least one haptic output device 160 and/or other human-computer interface devices.

The processor 110 may be a general-purpose or specific-purpose processor or microcontroller for managing or controlling the operations and functions of the system 100. For example, the processor 110 may be specifically designed as an application-specific integrated circuit ("ASIC") to control output signals to a driver of the input/output devices 130 to provide haptic effects. The processor 110 may be configured to decide, based on predefined factors, what haptic effects are to be generated based on a haptic signal received or determined by the processor 110, the order in which the haptic effects are generated, and the magnitude, frequency, duration, and/or other parameters of the haptic effects. The processor 110 may also be configured to provide streaming commands that can be used to drive the haptic output device 160 for providing a particular haptic effect. In some embodiments, the processing device 110 may actually include a plurality of processors, each configured to perform certain functions within the electronic device 100. The processor 110 is described in further detail below.

The memory device 120 may include one or more internally fixed storage units, removable storage units, and/or remotely accessible storage units. The various storage units may include any combination of volatile memory and non-volatile memory. The storage units may be configured to store any combination of information, data, instructions, software code, etc. More particularly, the storage devices may include haptic effect profiles, instructions for how the haptic output device 160 of the input/output devices 130 is to be driven, or other information for generating haptic effects.

The bus 140 may be configured to allow signal communication between the various components of the system 100 and also to access information from remote computers or servers through, for example, a network. The network may include any one or more of, for instance, the Internet, an intranet, a PAN (Personal Area Network), a LAN (Local Area Network), a WAN (Wide Area Network), a SAN (Storage Area Network), a MAN (Metropolitan Area Network), a wireless network, a cellular communications network, a Public Switched Telephone Network, and/or other network.

The sensor 150 may be configured as any suitable input device configured to sense movement of a user's skin against a surface at which the sensor 150 is located, as described in further detail below. The sensor 150 may sense the presence of a person's skin through capacitive, resistive, or inductive coupling, but is not limited to those techniques.

The haptic output device 160 is configured to provide haptic feedback to at least a portion of the system 100, which can be conveyed to a user in contact with the system 100. Particularly, the haptic output device 160 may provide haptic feedback to a surface of the input/output devices 130 to impose a haptic effect when the user is in contact with the surface, as described in further detail below. The haptic effects may be used to enhance the user experience when interacting with the system 100 and or provide information to the user in the form of a notification, as described in further detail below.

The haptic effects may be created with any of the methods of creating haptics, such as electrostatic or ultrasonic friction, deformation, vibration, kinesthetic sensations, etc. In an embodiment, the haptic output device 160 may include non-mechanical or non-vibratory devices such as those that use electrostatic friction (ESF), ultrasonic surface friction (USF), or those that induce acoustic radiation pressure with an ultrasonic haptic transducer, or those that use a haptic substrate and a flexible or deformable surface, or those that provide projected haptic output such as a puff of air using an air jet, and so on. In an embodiment, the haptic output device 160 may include an actuator, for example, an electromagnetic actuator such as an Eccentric Rotating Mass ("ERM") in which an eccentric mass is moved by a motor, a Linear Resonant Actuator ("LRA") in which a mass attached to a spring is driven back and forth, or a "smart material" such as piezoelectric materials, electro-active polymers or shape memory alloys, a macro-composite fiber actuator, an electro-static actuator, an electrotactile actuator, and/or another type of actuator that provides a physical feedback such as a haptic (e.g., vibrotactile) feedback. Multiple haptic output devices 160 may be used to generate different haptic effects, so that different notifications may be communicated to the user at the same surface.

The system 100 may be provided to or be part of any object having a surface that routinely comes into contact with a user's skin. For example, the system may be part of a desktop computer, laptop computer, electronic workbook, electronic handheld device (such as a mobile phone, smart phone, gaming device, personal digital assistant ("PDA"), portable e-mail device, portable Internet access device, calculator, etc.), game controller, wearable device, or a support that does not normally include an electronic device, such as a table or chair. Examples of implementations of the system 100 according to embodiments of the invention are described in further detail below.

Figure 2:
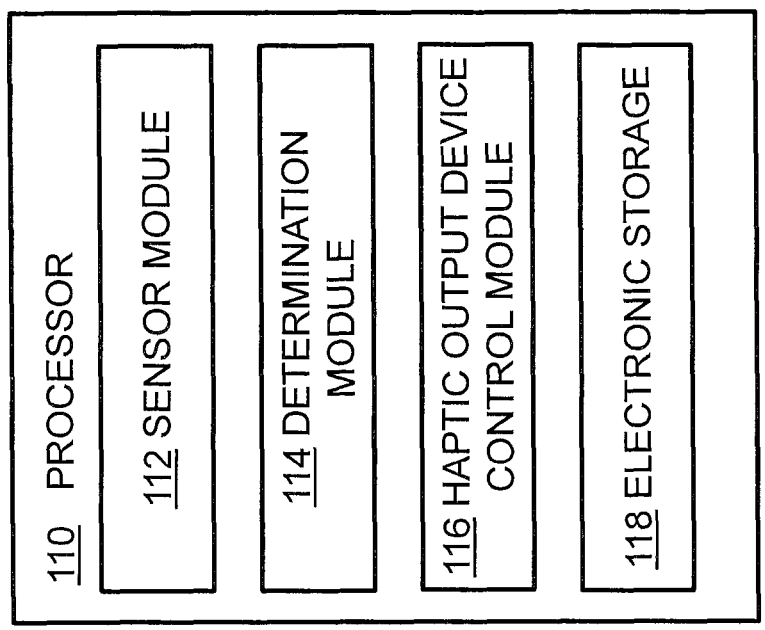
FIG. 2 is a schematic illustration of a processor of the system of FIG. 1.

FIG. 2 illustrates an embodiment of the processor 110 in more detail. The processor 110 may be configured to execute one or more computer program modules. The one or more computer program modules may include one or more of a sensor module 112, a determination module 114, a haptic output device control module 116, and/or other modules. The processor 110 may also include electronic storage 118, which may be the same as the memory device 120 or in addition to the memory device 120. The processor 110 may be configured to execute the modules 112, 114, and/or 116 by software, hardware, firmware, some combination of software, hardware, and/or firmware, and/or other mechanisms for configuring processing capabilities on processor 110.

It should be appreciated that although modules 112, 114, and 116 are illustrated in FIG. 2 as being co-located within a single processing unit, in embodiments in which the processor 110 includes multiple processing units, one or more of modules 112, 114, and/or 116 may be located remotely from the other modules. The description of the functionality provided by the different modules 112, 114, and/or 116 described below is for illustrative purposes, and is not intended to be limiting, as any of the modules 112, 114, and/or 116 may provide more or less functionality than is described. For example, one or more of the modules 112, 114, and/or 116 may be eliminated, and some or all of its functionality may be provided by other ones of the modules 112, 114, and/or 116. As another example, the processor 110 may be configured to execute one or more additional modules that may perform some or all of the functionality attributed below to one of the modules 112, 114, and/or 116.

The sensor module 112 is configured to receive an input signal from the sensor 150 that is generated when the sensor 150 detects relative movement between the surface at which the sensor 150 is located and the user's skin. The sensor module 112 is also configured to send a signal to the determination module 114 for further processing.

The determination module 114 is configured to determine whether a notification is to be generated and sent to the user upon detecting presence of the user via the sensor 150. In an embodiment, the user may provide a particular gesture to the surface at which the sensor 150 is located that indicates that the user would like to receive certain information that may be provided via a notification. The determination module 114 may be programmed with a library of predetermined gestures so that when the user touches a particular location on the surface or provides a gesture to the surface, the determination module 114 may determine a corresponding output. For example, in an embodiment in which the system 100 is provided to a laptop computer, the user may rub his/her palms against the portions of the housing of the computer on which the user's palms normally rest using a particular motion and the determination module 114 may determine that the user would like a notification on the amount of charge that is left in the battery of the laptop computer. In addition, the determination module 114 may also output a signal to the haptic output device control module 116 so that a haptic effect providing the requested notification information may be provided to the user.

The haptic output device control module 116 is configured to determine the haptic effect to be generated by the haptic output device 160, based on the signal generated by the determination module 114. Determining the haptic effect may include determining one or more parameters that include an amplitude, frequency, duration, etc., of the haptic effect that will provide the desired notification to the user, as discussed in further detail below.

FIG. 3 illustrates an embodiment of the input/output devices 130 of the system 100 of FIG. 1 that provides a haptic effect to a user of the system 100 at a surface 310 of the input/output devices 130. As used herein, a haptic effect refers to a stimulus or force, including but not limited to a vibration, an attractive or repulsive force, a voltage or current, some other mechanical or electromagnetic force, heating or cooling, or some other stimulus. The haptic effect may comprise one or a combination of the forces or stimuli described herein. A plurality of haptic effects may be combined to form an overall haptic effect. The haptic effect may be outputted to provide feedback to a user or object in sliding interaction with the surface 310. The haptic effect may provide the feedback through mechanical movement, such as through vibrations of a solid object, vibrations of fluids, or actuating objects like pins or rods to touch the user. The pins or rods may deform the surface by changing the surface relief or contour. The overall haptic effect may also provide feedback through electrostatic interactions, either to generate a force on an object, like a finger F or palm of the user's hand at the surface 310, or to send an electric signal to an object that can perceive the signal, like a nerve of the finger F or hand.

The input/output devices 130 in this embodiment interface with the user through the surface 310 that is configured to sense an object that is touching the surface 310. The object may be the user's finger F, a palm of the user's hand, or any other part of the user's body that can sense a haptic effect. The object may also be a stylus or some other device whose presence can be sensed by the input/output devices 130. The input/output devices 130 may sense the presence of the object through, for example, capacitive, resistive, or inductive coupling.

The input/output devices 130 of the system 100 may provide haptic effects at the surface 310 through one or more haptic output devices in the form of actuators 330, 332, 334, an electrostatic device 340, or through combinations thereof. The actuators 330, 332, and 334 are configured to generate mechanical motion that may translate into a haptic effect at the surface 310. The actuators 330, 332, 334 may be implemented as piezoelectric actuators, voice coils, magnetic actuators such as solenoids, pneumatic actuators, ultrasonic energy actuators, an eccentric mass actuator, an electroactive polymer actuator, a shape memory alloy, or some other type of actuator, as described above. The actuators 330, 332, 334 may rely on motors that convert torque into vibrations, on fluid pressure, on changes in the shape of a material, or on other forces that generate motion. Further, the actuators 330, 332, 334 are not limited to generating vibrations, but may instead generate lateral motion, up and down motion, rotational motion, or some combinations thereof, or some other motion.

In an embodiment, the actuator 330 may be a piezoelectric or a voice coil actuator that generates vibrations to generate a haptic effect, the actuator 332 may be a solenoid that generates up and down motion to generate a haptic effect, and the actuator 334 may be a pneumatic actuator that generates lateral motion to generate a haptic effect. The actuators 330, 332, 334 may all be activated when a particular notification to be provided to the user is desired, or only one may be activated to conserve power or to generate a different haptic effect or effects. A particular actuator may be positioned and configured to generate a haptic effect for the entire surface 310, or for only a portion of the surface 310.

The electrostatic device 340 may be an electrovibrotactile display or any other device that applies voltages and currents instead of mechanical motion to generate a haptic effect. The electrostatic device 340 in this embodiment has at least a conducting layer 342 having at least one electrode, and an insulating layer 344. The conducting layer 342 may include any semiconductor or other conductive material, such as copper, aluminum, gold, or silver. The insulating layer 344 may be glass, plastic, polymer, or any other insulating material. In an embodiment, the sensor 150 described above may be provided in the conducting layer 342 or the insulating layer 344. In an embodiment, the electrostatic device 340 may not have an insulating layer, so that an object can directly touch the conducting layer 342. A haptic effect may be generated by passing an electrical current from the conducting layer 342 to the object at or near the surface 310. In an embodiment, the insulating layer 344 may include one or more electrodes that can pass current to objects that touch the electrodes as the objects move across the insulating layer 344.

The system 100 may operate the electrostatic device 340 by applying an electric signal to the conducting layer 342. The electric signal may be an AC signal that capacitively couples the conducting layer 342 with an object near or touching the surface 310. The AC signal may be generated by a high-voltage amplifier. The input/output devices 130 may also rely on principles other than capacitive coupling to generate the haptic effect. For example, in an embodiment, an ultrasonic vibration device 336 may be used to generate ultrasonic friction effects that may be felt by the user's finger F or palm of a hand at the surface 310.

The capacitive coupling may control a level of friction and simulate a coefficient of friction or texture on the surface 310 to provide the haptic effect. A coefficient of friction is a simulated one in that while the surface 310 can be smooth, the capacitive coupling may produce an attractive force between an object near the surface 310 and the conducting layer 342. Increasing the attractive force may increase a level of friction at the surface 310 even when the structure of the material at the surface 310 has not changed. Varying the levels of attraction between the object and the conducting layer 342 can vary the friction on an object moving across the surface 310. Varying the friction force simulates a change in the coefficient of friction. Controlling friction through a haptic effect is discussed in more detail in U.S. patent application Ser. No. 13/092,269, titled "Electro-vibrotactile Display," filed Apr. 22, 2011, and published on Oct. 25, 2012 as United States Patent Application Publication No. 2012/0268412, the entire content of which is incorporated herein by reference. The simulated coefficient of friction may be changed by the actuators 330, 332, 334 as well. For example, the actuators 330, 332, 334 may increase the friction force by generating vibrations, or by changing the surface relief of the surface 310 to change the actual coefficient of friction.

The capacitive coupling may also generate the haptic effect by stimulating parts of the object near or touching the surface 310, such as mechanoreceptors in the skin of a user's finger F or palm of a hand, or components in a stylus that can respond to the coupling. The mechanoreceptors in the skin, for example, may be stimulated and sense the capacitive coupling as a vibration or some more specific sensation. For example, the conducting layer 342 can be applied with an AC voltage signal that couples with conductive parts of a user's finger F. As the user moves his or her finger F on the surface 310, the user may sense a texture of prickliness, graininess, bumpiness, roughness, stickiness, or some other texture.

In an embodiment, the haptic effect providing a notification may be generated to simulate a feature, such as a surface feature. For example, the simulated surface feature may be a spatial pattern, edge or border, or any other tactile sensation, whether natural or artificial, at the surface 310. The spatial pattern may include a grid of straight lines, a grid of concentric circles, a grid of points, a grid of tiles, any combination thereof, or any other spatial pattern that conveys information relevant to the notification. Varying the levels of attraction between the object and the conducting layer 342 can vary the friction on an object moving across the surface 310. A region having a different level of friction than surrounding regions may represent a spatial pattern component, a texture, or any other surface feature. Simulating surface features is discussed in more detail in U.S. patent application Ser. No. 13/665,526, titled "Method and Apparatus for Simulating Surface Features on a User Interface with Haptic Effects," filed Oct. 31, 2012, and published as United States Patent Application Publication No. 2014/0118127, the entire content of which is incorporated herein by reference.

To provide the same attractive force or to provide the same level of stimuli across many different objects or persons, the input/output devices 130 may also include a sensor that can measure the impedance at the surface 310. The sensor may measure the impedance by applying a pulse across the surface and measuring the surface voltage or by measuring the strength of the capacitive coupling. The sensor may use other known techniques for measuring impedance, and may compensate for varying ambient conditions such as the moisture in the air or temperature. The haptic effect may be adjusted based on the impedance of a person. For example, a more forceful haptic effect may be applied to an object with a higher impedance and a less forceful effect for one with lower impedance.

The input/output devices 130 may also include a sensor that measures the simulated coefficient of friction. This may be the same sensor as the sensor described above that measures the impedance, or it may be a different sensor. The sensor may measure the simulated coefficient based on a measured pressure that the surface 310 is receiving, such as from an object touching the surface 310, and on the movement of the object at the surface 310. Movement of the object may be measured based on how the pressure at the surface 310 changes over time and over locations on the surface 310. For example, the sensor may calculate a value representing the simulated coefficient of friction based on an acceleration of a user's finger F or palm of a hand on the surface 310 and on the pressure that the surface 310 receives from the user's finger F or palm of a hand.

The haptic effects providing notifications in accordance with embodiments of the invention may be generated by the actuators 330, 332, 334, the electrostatic device 340, and/or the ultrasonic vibration device 336 one at a time, or can be combined. For example, a voltage may be applied to the conducting layer 342 at a level high enough to both attract the skin of a finger F or palm of a hand touching the surface 310 and to stimulate mechanoreceptors within the skin. Simultaneous to this electro-vibrotactile haptic effect, electrostatic forces may be produced on the conducting layer 342 and the insulating layer 344 to create mechanical motion in those layers. The haptic effects may be combined with motions generated by one or a combination of actuators 330, 332, and 334. The devices may work together to simulate the coefficient of friction or texture on the surface of the screen. The actuators may generate vibrations, for example, to also simulate changes in the surface friction or texture.

The haptic effects and the sensors may be controlled by the processor 110 described above. The processor 110 may analyze the impedance, the simulated coefficient of friction, the surface pressure, a rate of movement measured at the surface, and other factors to determine whether there has been a triggering condition for a haptic effect or how forceful a haptic effect should be.

Embodiments of the input/output devices 130 described above may be implemented to provide haptic feedback to surfaces that are typically not sensitive nor augmented with haptic output devices, but against which a user's skin frequently slides during normal, everyday interactions. Such sliding interactions are prevalent in natural active touch, such as feeling the texture of a surface. The relative motion produced by sliding between a user's skin and surfaces allows for the user to feel changes in surface friction produced by electrostatic friction (ESF) and ultrasonic vibrations (USF) as described above, although other haptic technologies may also be used.

The sliding motion can be caused by the movement of the skin against a surface of an object. Haptic feedback may therefore be applied through any surface against which a user's skin, and in particular hands, naturally slide, such as for example, the flat surfaces of a laptop computer against which a user's hands rest and slide while interacting with its keyboard and touchpad. Other examples include tables, counters, chairs, poles and other surfaces against which a person's hands may rest or move.

The sliding motion may also be caused by the movement of an object against the skin. Haptic effects may in this case be applied through a variety of surfaces that naturally slide against the skin or can easily be made to do so. Wearable objects, such as glasses, gloves, clothes, watches and jewelry, such as necklaces and rings, for example, often slide against the skin while being put on or taken off, or due to body movement while worn. Handheld objects, such as pens and styluses, power tools, and smartphones also often slide against the hand as they are manipulated. Certain objects, such as conveyor belts, are also in constant motion relative to the skin while in operation.

The sliding motions described above may be the result of either natural interactions with the surfaces, or purposeful interactions intended to extract information by touch. For example, the texture of an inner face of a watch may be felt as it naturally slides against the wrist or as it is purposefully moved against the wrist with another hand.

Several implementations of providing a notification in the form of haptic feedback as a result of a sliding motion are discussed below. The haptic feedback, for example, could communicate a variety of information about the object being touched or other objects in the form of notifications, for example the battery level of a device, the number of unread emails, or the appropriateness of an action in a given context. The haptic feedback may also provide a programmable feel for a surface, e.g. for branding or personalization. A sudden change in texture may also serve as a notification for an event, such as the receipt of a text message. The haptic feedback may be particularly appropriate for ambient communication that is minimally disruptive.

In an embodiment, the surface 310 may be configured to changes its haptic properties in order to replicate the sensation of touching a natural surface, such as a texture or embossed features. For example, information may be encoded in a surface texture produced either by vibrations or by a friction display. The haptic feedback may therefore be produced only while the skin and augmented surface 310 are sliding against one another, in synchrony with the motion. Asynchronous haptic effects may also be triggered based on sliding interactions.

Embodiments of the invention provide additional opportunities to communicate through touch by adding haptic feedback to surfaces that are naturally touched but are typically passive. Sliding interactions between a user's skin and a surface favors active touch, and therefore lead to more natural haptic interactions with vibrations, deformation or other haptic feedback, as described above. Sliding also enables the use of friction feedback that is generally pleasant and realistic, partly because it is not perceived in the absence of movement.

According to embodiments of the invention, the input/output devices 130 described above are provided to surfaces that typically do not produce haptic feedback. In view of the relative movement between the user's skin and the surfaces provided with the input/output devices, particularly the haptic output devices 160 described above, friction display technologies such as electrostatic friction (ESF) or ultrasonic vibrations (USV) may be particularly effective to provide the desired notifications. Other haptic output devices may also be used, such as devices that generate vibrations or deformations, pin arrays, thermal displays or electrotactile displays. Any haptic output device that can be configured to change the properties of a surface may be used.

The implementation of the haptic output devices 160 to the normally passive surfaces described below may vary with the technology used. In most implementations, the haptic output device 160 is connected to the augmented surface 310 and electronic circuits are used to supply the appropriate driving signals to the haptic output device 160. The processor 110 may also be used to produce appropriate driving signals and provide a simplified interface for other components of the system 100, for example accepting as input a frequency request and outputting the correct signal to produce the requested frequency as part of the determination module 114 and/or haptic output device control module 116 described above.

Embodiments of the invention also include computations to be done in order to determine what haptic output should be produced, if any. For example, the processor 110 may need to keep track of the number of unread emails on the user's computer or other electronic device and determine the appropriate haptic feedback to produce to communicate such information. The processor 110 may also need to monitor different sensors, such as the sensor 150 described above in order to detect touch input, and in particular relative motion of the user's skin and the augmented surface 310. The haptic output may be turned off in the absence of touch input in order to reduce power consumption. The haptic output may also be modulated based on the motion, for example to produce a spatial effect as a surface is touched with a sliding motion, as described above.

The augmented surface 310 may be classified in two categories, depending on whether the sliding motion is caused by the movement of the skin or surface 310. Examples of each are given in the Figures and described below. In some embodiments, the haptic feedback may be applied through a system or device that would be added to an existing product. For example, a surface that provides electrostatic friction (ESF) for the notification may be placed on top of a table instead of being physically integrated in the table.

FIGS. 4A-4E illustrate examples of surfaces of objects against which a user's hands rest and slide. For example, FIG. 4A illustrates a resting surface 402 for a user's hands below a keyboard 404 of a laptop computer 406. FIG. 4B illustrates a resting surface 408, for a user's hands, of a table 410 on which the laptop computer 406 sits. FIG. 4C illustrates a surface 412 of a computer mouse 414 on which a user's hand rests. FIG. 4D illustrates a surface 416 of an armrest 418 of a chair 420. FIG. 4E illustrates a surface 422 of a physical control of an automotive interface 424, such as a switch that controls the opening and closing of a window. Any of the surfaces 402, 408, 412, 416, 422 may be provided with embodiments of the system 100 described above.

Figure 5B:
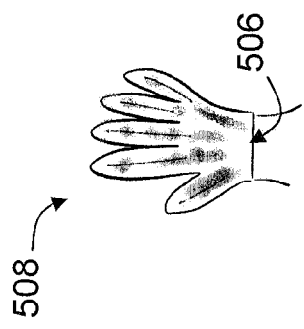
FIGS. 5A-5D illustrate surfaces of wearable articles that users wear for implementations of embodiments of the invention.
Figure 5D:
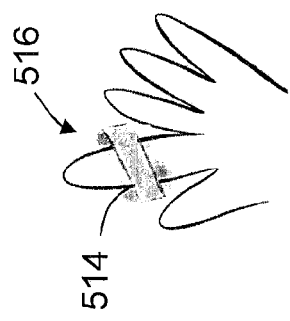
Figure 5A:
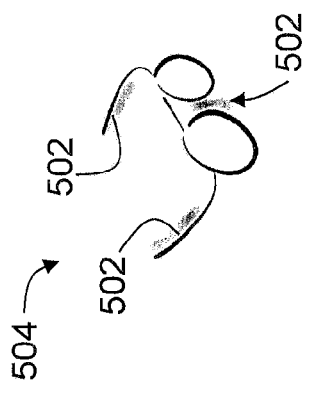
Figure 5C:
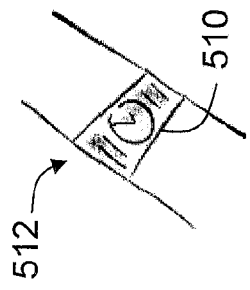

FIGS. 5A-5D illustrate examples of wearable articles that slide against the skin of the wearer during normal use. For example, FIG. 5A illustrates surfaces 502 of a pair of eyeglasses 504 that naturally slide against the wearer's skin. FIG. 5B illustrates surfaces 506 of a glove 508 that slide against the skin of the wearer as the glove 508 is being put on or taken off. FIG. 5C illustrates an inner surface 510 of a watch 512 that slides against the skin of the wearer's wrist as the body moves, or can be moved against the skin of the wrist intentionally by the wearer. FIG. 5D illustrates an inner surface 514 of a ring 516 that slides against the skin of the wearer's finger as the body moves, or can moved against the skin of the finger intentionally by the wearer. Any of the surfaces 502, 506, 510, 514 may be provided with embodiments of the system 100 described above.

Figure 6B:
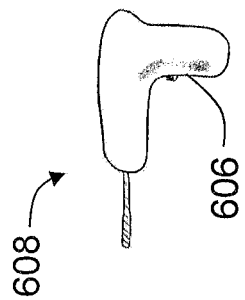
FIGS. 6A-6D illustrate surfaces of handheld objects that users hold for implementations of embodiments of the invention.
Figure 6D:
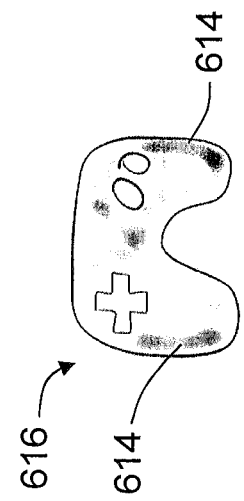
Figure 6A:
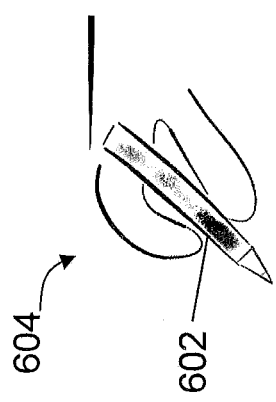
Figure 6C:
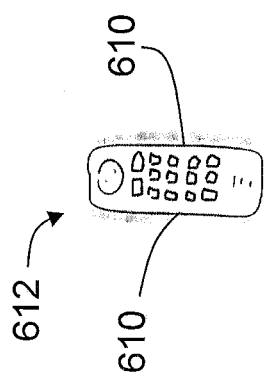

FIGS. 6A-6D illustrate examples of handheld objects that frequently slide against the skin of the user as they are being used and manipulated. For example, FIG. 6A illustrates a surface 602 of a pen or stylus 604 that is grasped by the user's hand. FIG. 6B illustrates a surface 606 of a power tool 608 against which the user's skin frequently slides as the user grips the tool 608. FIG. 6C illustrates surfaces 610 of a cordless phone 612 that rub against the skin of the user's hand when the user grasps the phone 612. FIG. 6D illustrates surfaces 614 of a game controller 616 that rub against the skin of the user as the user grasps the game controller 616. Any of the surfaces 602, 606, 610, 614 may be provided with embodiments of the system 100 described above.

Figure 7B:
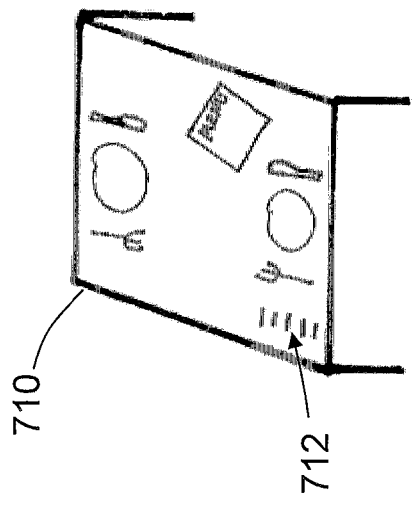
FIGS. 7A-7C illustrate embodiments of the invention as implemented in supporting surfaces.
Figure 7A:
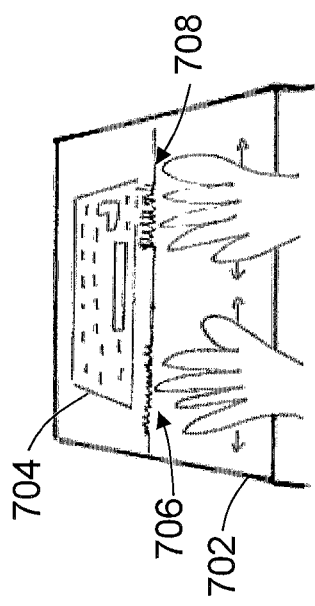
Figure 7C:
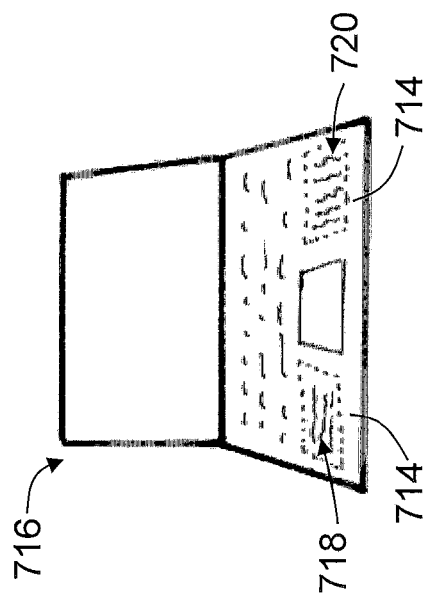

FIGS. 7A-7C illustrate examples of resting surfaces against which a person's hand slides that provide notifications to the person according to embodiments of the invention. FIG. 7A illustrates a user's hands resting on a table 702 as he/she is typing on a keyboard 704. By sliding his/her palms against the table 702, he/she can feel subtle textures that indicate information in the form of a notification, such as a notification 706 indicating the number of unread emails in the user's inbox and/or a notification 708 indicating the amount of time until the next meeting he/she is scheduled to attend. FIG. 7B illustrates a table 710 in a restaurant that is configured to provide a notification 712 that indicates the amount of time left before the meal is served by using a surface texture on the surface of the table 710. FIG. 7C illustrates an unused surface area 714 on a laptop computer 716 that is used to provide notifications via haptic feedback, such as a notification 718 indicating the number of unread emails in the user's inbox and/or a notification 720 indicating the remaining battery life of the battery in the laptop computer 716. The user can feel this haptic feedback though his/her palms while typing on the laptop 716.

Figure 8A:
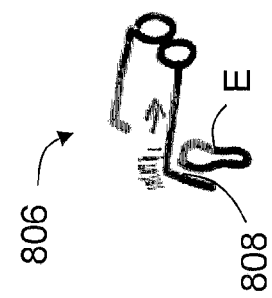
FIGS. 8A-8D illustrate embodiments of the invention as implemented in eyeglasses.
Figure 8B:
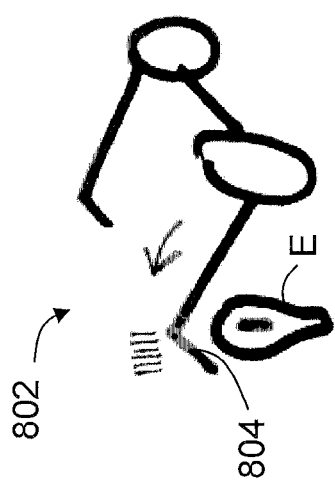
Figure 8C:
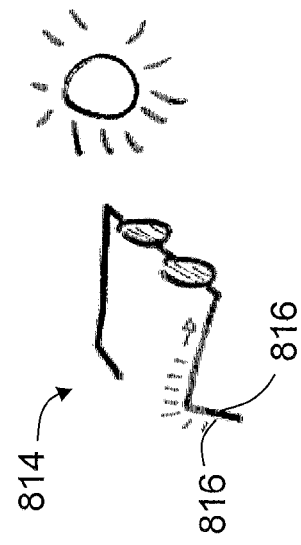
Figure 8D:
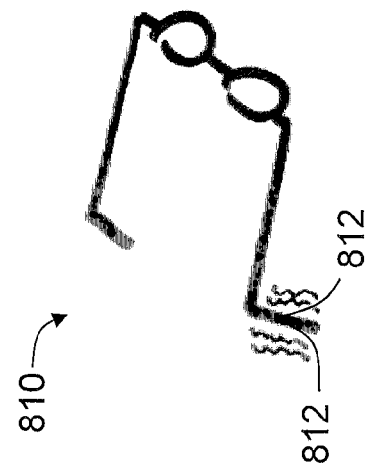

FIGS. 8A-8D illustrate examples of uses for haptic feedback on augmented eyeglasses. For example, FIG. 8A illustrates a pair of eyeglasses 802 that includes a surface 804 that rests behind the user's ear E on which a texture communicates the state of the glasses 802 or another device, for example, a slippery texture when the battery of the device is full but a scratchy texture when the battery of the device is weak. FIG. 8B illustrates a pair of eyeglasses 806 that may require more effort to put on or take off by changing the friction of texture of a surface 808 contacting the skin of the wearer's ear E. Providing such a change in friction or texture may communicate a notification of a corresponding intent, such as a reminder to save a file before going home for the day or a warning that an ongoing task is about to be terminated or a preset maximum daily usage of a device or program is about to be exceeded. FIG. 8C illustrates a pair of eyeglasses 810 that may have at least one surface 812 programmed to have a specific feel, such as wood or satin when the wearer's skin rubs against the surface 812. FIG. 8D illustrates a pair of sunglasses 814 that communicates a notification providing the level of UV light with a texture at a surface 816 of the sunglasses 814, which may prompt the wearer to apply sunscreen.

FIGS. 9A and 9B illustrate other embodiments of wearable articles that are configured to provide notifications to the wearer. For example, FIG. 9A illustrates a glove 902 being slid onto the wearer's hand against the wearer's skin. The texture of the inner surface of the glove 902 may provide a notification 904 that indicates whether the glove 902 should be worn based on the weather forecast, such as temperature. FIG. 9B illustrates a watch or bracelet 906 that also slides against the skin of the wearer while being worn. The watch 906 may be rotated relative to the wrist or arm of the wearer to feel a notification 908 providing information about the amount of the time remaining until the next meeting scheduled for the wearer.

Figure 10B:
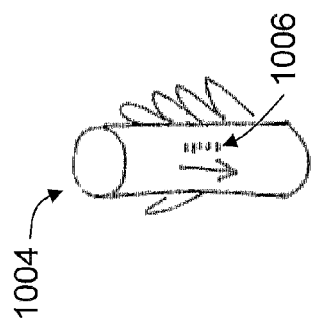
FIGS. 10A-10D illustrate embodiments of the invention as implemented in handheld objects.
Figure 10A:
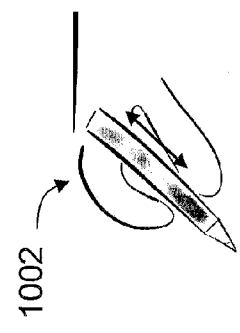
Figure 10D:
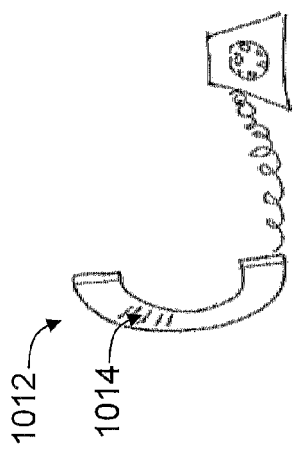
Figure 10C:
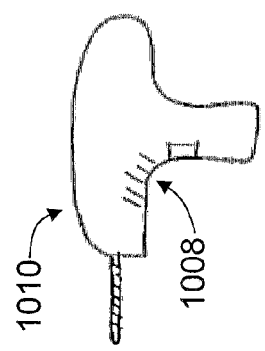

FIGS. 10A-10D illustrate examples of handheld objects that slide against the hand of the user during normal use. For example, FIG. 10A illustrates a pen or stylus 1002 that moves against the skin of his/her hand, as indicated by the double arrow. A notification may be provided on the surface of the pen or stylus that provides information about the pen or stylus currently being used or the battery life of a related device. This notification may also be felt when first grasping the pen 1002, which often involves letting the pen 1002 slide to the correct position. FIG. 10B illustrates a hand holding an object 1004 that either intentionally or inadvertently slides between the fingers of the hand. Haptic feedback 1006 may be provided as a notification as the object 1004 slides, warning that the object 1004 is sliding too much, or communicating some other information about the object 1004, including simulated textures. FIG. 10C illustrates haptic feedback 1008 being applied as a notification through the body of a tool 1010 in the form of a power drill. The notification 1008 may indicate the battery level or some other condition of the tool 1010, such as whether the motor is overheating. FIG. 10D illustrates haptic feedback 1012 being applied to a phone 1014 as a notification, for example, to indicate the amount of time that has been spent on the current call.

Figure 11:
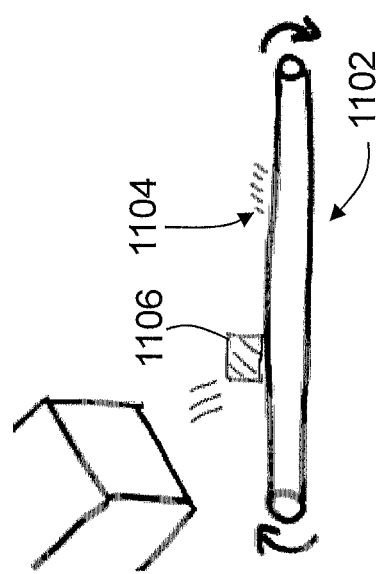
FIG. 11 illustrates an embodiment of the invention as implemented in a conveyor belt.

FIG. 11 illustrates another example of an object that moves against the skin. As illustrated, a conveyor belt 1102 continuously slides relative to a worker (not shown) standing next to the conveyor belt 1102, and may therefore be augmented with haptic feedback in accordance with embodiments of the invention. For example, friction feedback 1104 may be applied to the top surface of the moving conveyor belt 1102 and provide a notification to the worker that an object 1106 is about to be dropped on the conveyor belt 1102. The notification may be in the form of a change in texture that is felt by the working who is placing a hand on the conveyor belt 1102.

The embodiments described herein represent a number of possible implementations and examples and are not intended to necessarily limit the present disclosure to any specific embodiments. Instead, various modifications can be made to these embodiments as would be understood by one of ordinary skill in the art. Any such modifications are intended to be included within the spirit and scope of the present disclosure and protected by the following claims.

What is claimed is:

1. A system comprising:
   a touch-sensitive sensor configured to detect movement of an object along a surface; and
   a processor in communication with the touch-sensitive sensor and configured to:
   detect the movement of the object along the surface based on a sensor signal from the touch-sensitive sensor;
   determine a notification independently of the sensor signal, the notification configured to convey information;
   determine that the notification is to be output in response to detecting the movement of the object along the surface; and
   in response to determining that the notification is to be output, generate a haptic signal based on the information to be conveyed by the notification; and
   a haptic output device configured to output a haptic effect to the surface in response to the haptic signal.

2. The system according to claim 1, wherein the haptic output device comprises an electrostatic friction output device and the haptic effect is a change in friction of the surface.

3. The system according to claim 1, wherein the haptic effect comprises ultrasonic vibrations.

4. The system according to claim 1, wherein the haptic output device is configured to deform the surface to provide the haptic effect.

5. The system according to claim 1, wherein the surface is on a housing of a computer.

6. The system according to claim 5, wherein the notification comprises a low battery warning.

7. The system according to claim 5, wherein the notification provides an indication of a number of unread messages in an inbox.

8. The system according to claim 1, wherein the surface and the haptic output device are part of a wearable device.

9. The system according to claim 8, wherein the wearable device is selected from the group consisting of a watch, a bracelet, a necklace, and eye glasses.

10. The system according to claim 1, wherein the notification is based on at least one parameter selected from the group consisting of: time, priority, and quantity.

11. The system of claim 1, wherein the object is a first body part, and the surface is positioned to contact the first body part during an interaction between a second body part and an input device, wherein the input device is configured to transmit an input signal to the processor in response to the interaction.

12. The system of claim 11, wherein the surface is on a piece of furniture and positioned to support the first body part during the interaction between the second body part and the input device.

13. The system of claim 11, wherein the surface is on a tool and positioned to be grasped by the first body part during the interaction between the second body part and the input device.

14. The system of claim 11, wherein the surface is a housing that is coupled to the input device, the touch-sensitive sensor, and the processor, and wherein the input device comprises a touchpad or a touchscreen.

15. The system of claim 11, wherein the surface is positioned on a first item and the input device is positioned on a second item that is separate from the first item.

16. A method comprising:
 detecting an object is moving along a surface based on a sensor signal from a touch-sensitive sensor;
 determining a notification independently of the sensor signal, the notification configured to convey information;
 determining that the notification is to be output in response to detecting that the object is moving along the surface; and
 in response to determining that the notification is to be output, causing a haptic effect to be output at the surface, the haptic effect based on the information to be conveyed by the notification.

17. The method according to claim 16, wherein causing the haptic effect to be output comprises changing the friction of the surface.

18. The method according to claim 16, wherein the haptic effect comprises ultrasonic vibrations.

19. The method according to claim 16, wherein causing the haptic effect to be output comprises deforming the surface.

20. The method according to claim 16, wherein the notification is based on at least one parameter selected from the group consisting of: time, priority, and quantity.

21. The method according to claim 16, wherein the surface is part of a wearable device.

22. The method according to claim 21, wherein the wearable device is selected from the group consisting of a watch, a bracelet, a necklace, and eye glasses.

23. A non-transitory computer-readable medium comprising program code that is executable by a processor for causing the processor to:
 detect movement of an object along a surface based on a sensor signal from a touch-sensitive sensor;
 determine a notification independently of the sensor signal, the notification configured to convey information;
 determine that the notification is to be output in response to the detecting the movement of the object along the surface; and
 in response to determining that the notification is to be output, cause a haptic effect to be output at the surface, the haptic effect based on the information to be conveyed by the notification.

24. The non-transitory computer-readable medium according to claim 23, wherein causing the haptic effect to be output comprises changing the friction of the surface.

* * * * *